United States Patent
Hatakenaka et al.

(10) Patent No.: US 9,564,525 B2
(45) Date of Patent: Feb. 7, 2017

(54) COMPOUND SEMICONDUCTOR DEVICE

(71) Applicant: Mitsubishi Electric Corporation, Tokyo (JP)

(72) Inventors: Susumu Hatakenaka, Tokyo (JP); Harunaka Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/990,063

(22) Filed: Jan. 7, 2016

(65) Prior Publication Data

US 2016/0336438 A1    Nov. 17, 2016

(30) Foreign Application Priority Data

May 14, 2015    (JP) ................ 2015-099265

(51) Int. Cl.
*H01L 29/778*    (2006.01)
*H01L 29/66*    (2006.01)
*H01L 29/205*    (2006.01)
*H01L 29/04*    (2006.01)
*H01L 29/207*    (2006.01)

(52) U.S. Cl.
CPC .......... *H01L 29/7787* (2013.01); *H01L 29/04* (2013.01); *H01L 29/205* (2013.01); *H01L 29/207* (2013.01)

(58) Field of Classification Search
CPC ............. H01L 29/1029; H01L 29/15; H01L 29/66462; H01L 29/7783; H01L 29/7787
USPC .......... 257/E21.403, E29.246, 194; 438/172
See application file for complete search history.

(56) References Cited

U.S. PATENT DOCUMENTS

| | | | | |
|---|---|---|---|---|
| 2002/0185655 A1* | 12/2002 | Fahimulla | ............. | B82Y 10/00 257/192 |
| 2007/0215905 A1* | 9/2007 | Kohiro | ............... | H01L 21/0237 257/194 |
| 2010/0301395 A1* | 12/2010 | Xu | ...................... | H01L 29/7784 257/194 |
| 2011/0156100 A1 | 6/2011 | Chang et al. | | |
| 2014/0159117 A1* | 6/2014 | Taniguchi | .......... | H01L 29/4232 257/194 |
| 2014/0335800 A1* | 11/2014 | Takeuchi | .............. | H01L 29/205 455/83 |

FOREIGN PATENT DOCUMENTS

| | | |
|---|---|---|
| JP | H04-028237 A | 1/1992 |
| JP | H07-249757 A | 9/1995 |
| JP | H08-032052 A | 2/1996 |
| JP | 2001-127283 A | 5/2001 |
| JP | 2011-139014 A | 7/2011 |

* cited by examiner

*Primary Examiner* — David Vu
*Assistant Examiner* — Jonathan Han
(74) *Attorney, Agent, or Firm* — Studebaker & Brackett PC

(57) ABSTRACT

A compound semiconductor device includes: a substrate; and a buffer layer, a first carrier supply layer, a first spacer layer, a channel layer, a second spacer layer, a second carrier supply layer, and a contact layer provided in order on the substrate, wherein the first carrier supply layer is a uniformly doped layer in which an impurity is uniformly doped, the second carrier supply layer is a planar doped layer in which an impurity is locally doped, and no Al mixed crystal layer having higher resistance values than the first and second spacer layers is provided between the buffer layer and the first spacer layer and between the second spacer layer and the contact layer.

10 Claims, 7 Drawing Sheets

COMPOUND SEMICONDUCTOR DEVICE

BACKGROUND OF THE INVENTION

Field of the Invention

The present invention relates to a compound semiconductor device such as a high electron mobility transistor.

Background Art

Taking advantage of excellent high frequency characteristics thereof, high electron mobility transistors (HEMT) are used as amplifiers for receiving antennas for satellite broadcasting and vehicle-mounted millimeter wave radars or the like. Among HEMT epitaxial structures being commercialized in recent years, double-doped HEMTs are the mainstream, which have carrier supply layers on not only the upper side but also the lower side of a channel layer in order to supply carriers to the channel layer which is the carrier traveling layer at high concentration and efficiently.

As the carrier supply layer of a double-doped HEMT, a uniformly doped supply layer is used which has a desired thickness and in which an impurity is uniformly doped. In order to improve HEMT performance, a planar doped supply layer is also used which implements a high-concentration thin-film supply layer, that is, locally high concentration impurity doping.

However, locally high concentration impurity doping makes the impurity more likely to diffuse, and it is known that the impurity enters the channel layer from the planar doped supply layer on the lower side, preventing the HEMT performance from improving.

As such an impurity diffusion suppression method, reduction of thermal history through lowering the temperature and reducing the time period of epitaxial growth has been proposed (e.g., see Japanese Patent Application Laid-Open No. 7-249757). As an impurity diffusion suppression structure for a GaAs-based HEMT, a structure is proposed in which In is added to a GaAs or AlGaAs layer in the vicinity of a planar doped layer to reduce lattice distortion of the planar doped layer which is the cause of diffusion (e.g., see Japanese Patent Application Laid-Open No. 8-32052). There is also a proposal of a structure in which an Al mixed crystal layer is formed adjacent to the planar doped layer or the like to improve mobility.

In the technique of implementing temperature lowering of epitaxial growth, there is concern about deterioration of reliability because an impurity such as oxygen is more likely to be mixed in an Al containing layer in particular. On the other hand, in the technique of adding In to a layer in the vicinity of the planar doped layer, the epitaxial structure or growth process becomes complicated, making stable production difficult. Moreover, provision of the Al mixed crystal layer causes the Al mixed crystal layer to become a resistive layer and increase source series resistance, resulting in a problem that the high frequency characteristic deteriorates and mobility decreases.

SUMMARY OF THE INVENTION

The present invention has been made to solve the above-described problems and it is an object of the present invention to provide a compound semiconductor device with a simple structure, capable of suppressing impurity diffusion, improving characteristics and stabilizing production.

According to the present invention, a compound semiconductor device includes: a substrate; and a buffer layer, a first carrier supply layer, a first spacer layer, a channel layer, a second spacer layer, a second carrier supply layer, and a contact layer provided in order on the substrate, wherein the first carrier supply layer is a uniformly doped layer in which an impurity is uniformly doped, the second carrier supply layer is a planar doped layer in which an impurity is locally doped, and no Al mixed crystal layer having higher resistance values than the first and second spacer layers is provided between the buffer layer and the first spacer layer and between the second spacer layer and the contact layer.

In the present invention, it is possible to suppress diffusion of an impurity that prevents traveling of electrons in the channel layer by adopting uniform doping for the carrier supply layer on the lower side of the channel layer. Furthermore, any resistance layers such as Al mixed crystal layers are not provided. This prevents the source series resistance from increasing, and can thereby improve mobility without causing the high frequency characteristic to deteriorate. As a result, it is possible to suppress diffusion of impurity with a simple structure, improve characteristics and achieve stable production.

Other and further objects, features and advantages of the invention will appear more fully from the following description.

DETAILED DESCRIPTION OF THE PREFERRED EMBODIMENTS

A compound semiconductor device according to the embodiments of the present invention will be described with reference to the drawings. The same components will be denoted by the same symbols, and the repeated description thereof may be omitted.

First Embodiment

Figure 1:
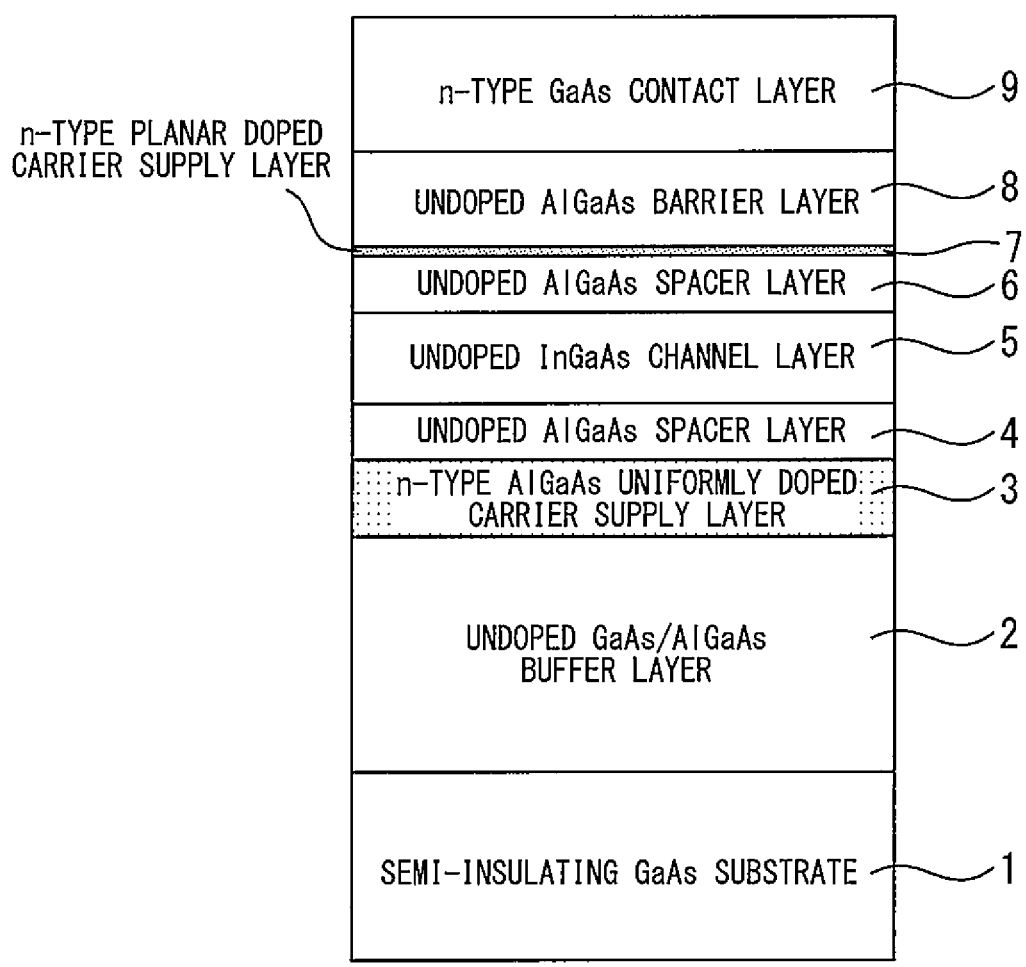
FIG. 1 is a cross-sectional view illustrating a compound semiconductor device according to a first embodiment of the present invention.

FIG. 1 is a cross-sectional view illustrating a compound semiconductor device according to a first embodiment of the present invention. This compound semiconductor device has a HEMT epitaxial structure. That is, a buffer layer 2 which is an undoped GaAs or AlGaAs insulating layer, an n-type AlGaAs uniformly doped carrier supply layer 3, an undoped AlGaAs spacer layer 4, an undoped InGaAs channel layer 5, an undoped AlGaAs spacer layer 6, an n-type planar doped carrier supply layer 7, an undoped AlGaAs barrier layer 8, and an n-type GaAs contact layer 9 are provided in order on a semi-insulating GaAs substrate 1.

The n-type AlGaAs uniformly doped carrier supply layer 3 is a uniformly doped layer in which an impurity is uniformly doped. The n-type planar doped carrier supply layer 7 is a planar doped layer in which an impurity is locally doped. Only the n-type AlGaAs uniformly doped carrier supply layer 3 exists between the buffer layer 2 and the undoped AlGaAs spacer layer 4, and only the undoped AlGaAs barrier layer 8 and the n-type planar doped carrier supply layer 7 exist between the undoped AlGaAs spacer layer 6 and the n-type GaAs contact layer 9. No Al mixed crystal layer having higher resistance values than the undoped AlGaAs spacer layers 4 and 6 is provided in these regions.

Next, a method of manufacturing the compound semiconductor device according to the present embodiment will be described. Metal organic vapor phase epitaxy (MOVPE) or molecular beam epitaxy (MBE) or the like is used as the method for growing each semiconductor layer. Here, the MOVPE method is used and trimethyl aluminum (TMAl) is used as an Al raw material, trimethyl gallium (TMGa) is used as a Ga raw material, trimethyl indium (TMIn) is used as an In raw material, arsine ($AsH_3$) is used as an As raw material, silane ($SiH_4$) is used as a Si raw material and hydrogen is used as a carrier gas.

GaAs and AlGaAs are alternately laminated in a plurality of layers on the semi-insulating GaAs substrate 1 at a growth temperature of 700° C. to form the buffer layer 2. Next, a dopant gas is supplied and 3 to 15 nm n-type AlGaAs uniformly doped carrier supply layer 3 having carrier concentration of $5 \times 10^{18}$ cm$^{-3}$ or less or preferably $3 \times 10^{18}$ cm$^{-3}$ or less is formed. Next, the supply of $SiH_4$ which is the dopant gas is stopped and the 3 to 5 nm undoped AlGaAs spacer layer 4 is formed. The growth temperature is decreased to 500 to 600° C. and the undoped InGaAs channel layer 5 is caused to grow 5 to 30 nm. After increasing the temperature to 700° C., the 3 to 5 nm undoped AlGaAs spacer layer 6 is formed. Next, the supply of TMAl and TMGa is stopped, $SiH_4$ and $AsH_3$ are supplied, and the n-type planar doped carrier supply layer 7 having a sheet carrier concentration of 1 to $5 \times 10^{12}$ cm$^{-2}$ is formed. The supply of $SiH_4$ is stopped, TMAl and TMGa are supplied again and the 5 to 50 nm undoped AlGaAs barrier layer 8 is formed. Lastly, 50 to 300 nm n-type GaAs contact layer 9 having a carrier concentration of $2 \times 10^{18}$ cm$^{-3}$ or more is formed.

Figure 2:
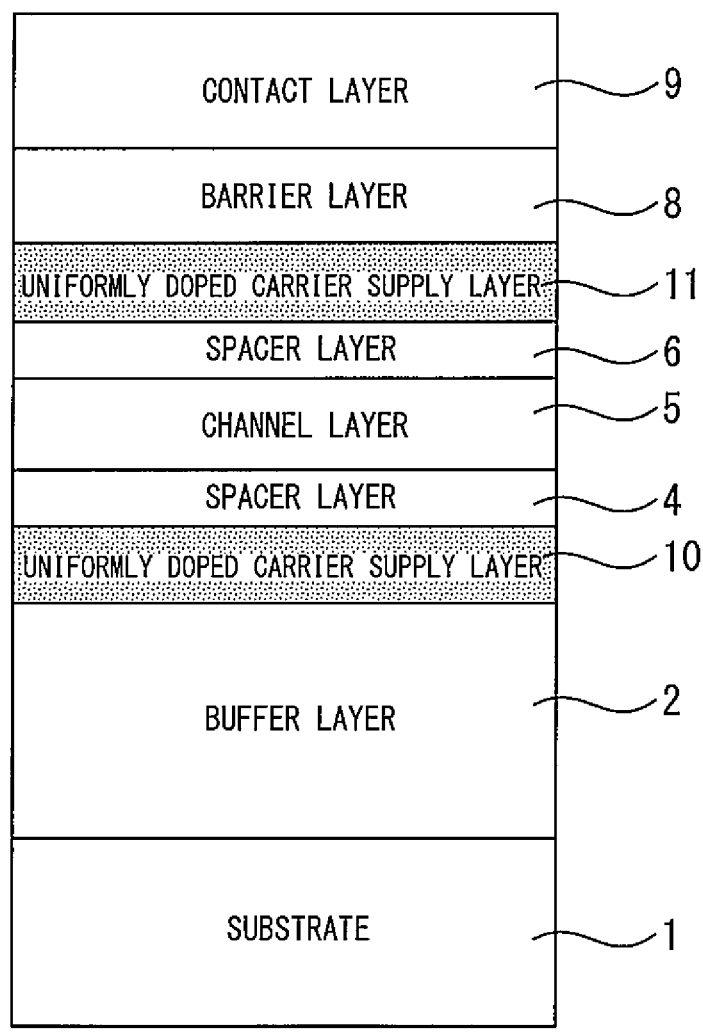
FIG. 2 is a cross-sectional view illustrating a compound semiconductor device according to comparative example 1.
Figure 3:
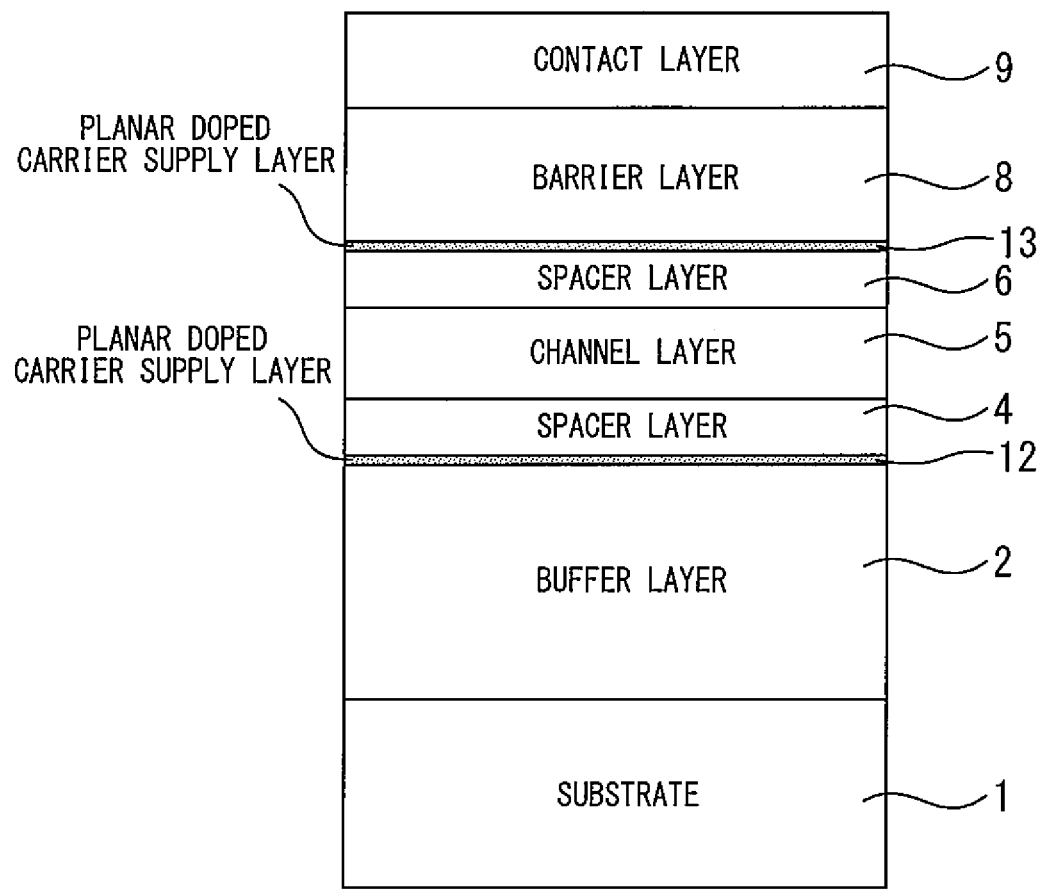
FIG. 3 is a cross-sectional view illustrating a compound semiconductor device according to comparative example 2.
Figure 4:
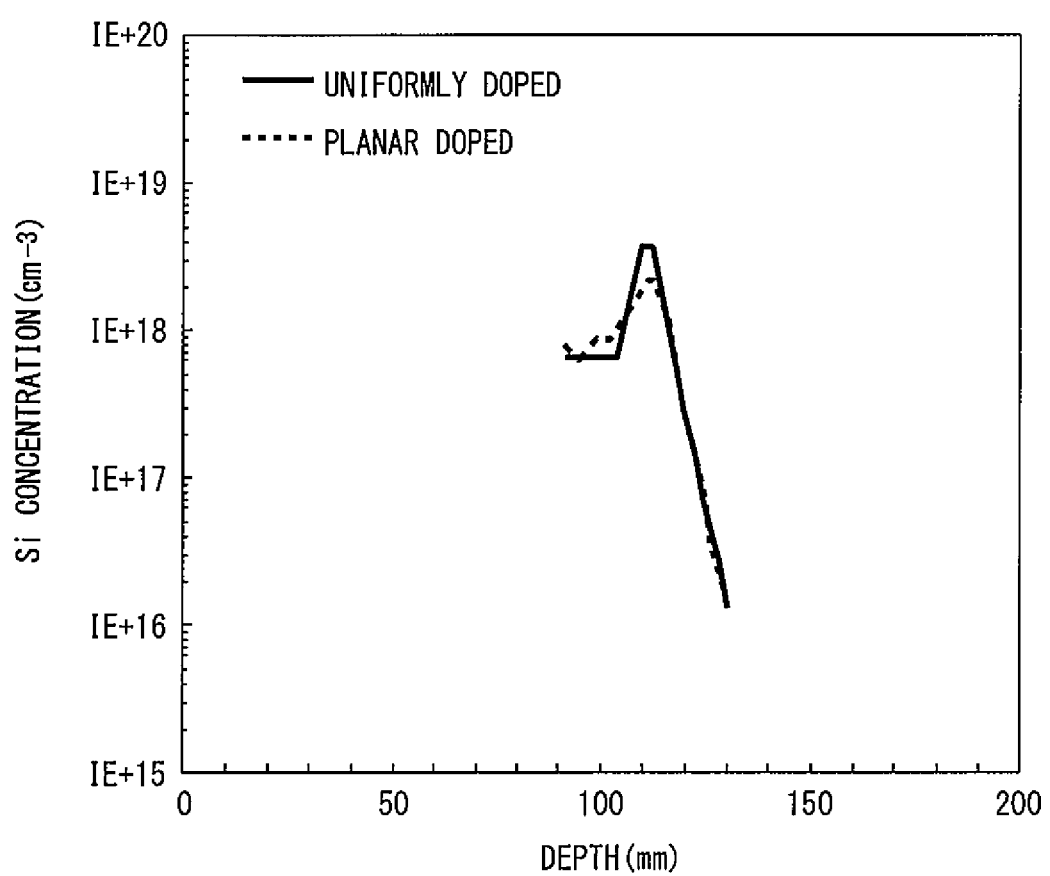
FIG. 4 is a diagram illustrating a comparison of diffusion of Si between uniform doping and planar doping.

Next, effects of the present embodiment will be described in comparison with comparative examples 1 and 2. FIG. 2 is a cross-sectional view illustrating a compound semiconductor device according to comparative example 1. FIG. 3 is a cross-sectional view illustrating a compound semiconductor device according to comparative example 2.

In comparative example 1, the upper and lower carrier supply layers are uniformly doped carrier supply layers 10 and 11. In comparative example 2, the upper and lower carrier supply layers are planar doped carrier supply layers 12 and 13. The planar doped carrier supply layers such as comparative example 2 rather than comparative example 1 is preferably used to improve the performance of HEMT. However, comparative example 2 has a problem that an impurity is mixed with the undoped InGaAs channel layer 5 from the planar doped supply layer 12 on the lower side, preventing the HEMT performance from improving.

According to the present embodiment, it is possible to suppress diffusion of an impurity such as Si that prevents traveling of electrons in the undoped InGaAs channel layer 5 by adopting uniform doping for the carrier supply layer on the lower side of the undoped InGaAs channel layer 5. FIG.

4 is a diagram illustrating a comparison of diffusion of Si between uniform doping and planar doping.

By suppressing diffusion of Si into the undoped InGaAs channel layer 5, the mobility which is an index of HEMT performance is improved by 31% from 4500 to 5900 cm$^2$/Vs in the first embodiment compared to comparative example 2 as shown in Table 1.

TABLE 1

|  | Upper layer | Lower layer | Mobility (cm$^2$/Vs) |
| --- | --- | --- | --- |
| Comparative example 2 | Planar | Planar | 4500 |
| First embodiment | Planar | Uniform | 5900 |

Here, the channel In composition is 11% and channel sheet carrier concentration is $2.1 \times 10^{12}$ cm$^{-2}$.

In the present embodiment, no Al mixed crystal layer having a higher resistance value than the undoped AlGaAs spacer layers 4 and 6 is provided between the buffer layer 2 and the undoped AlGaAs spacer layer 4 or between the undoped AlGaAs spacer layer 6 and the n-type GaAs contact layer 9. This prevents the source series resistance from increasing, and can thereby improve mobility without causing the high frequency characteristic to deteriorate. As a result, it is possible to suppress diffusion of impurity with a simple structure, improve characteristics and achieve stable production.

Second Embodiment

Figure 5:
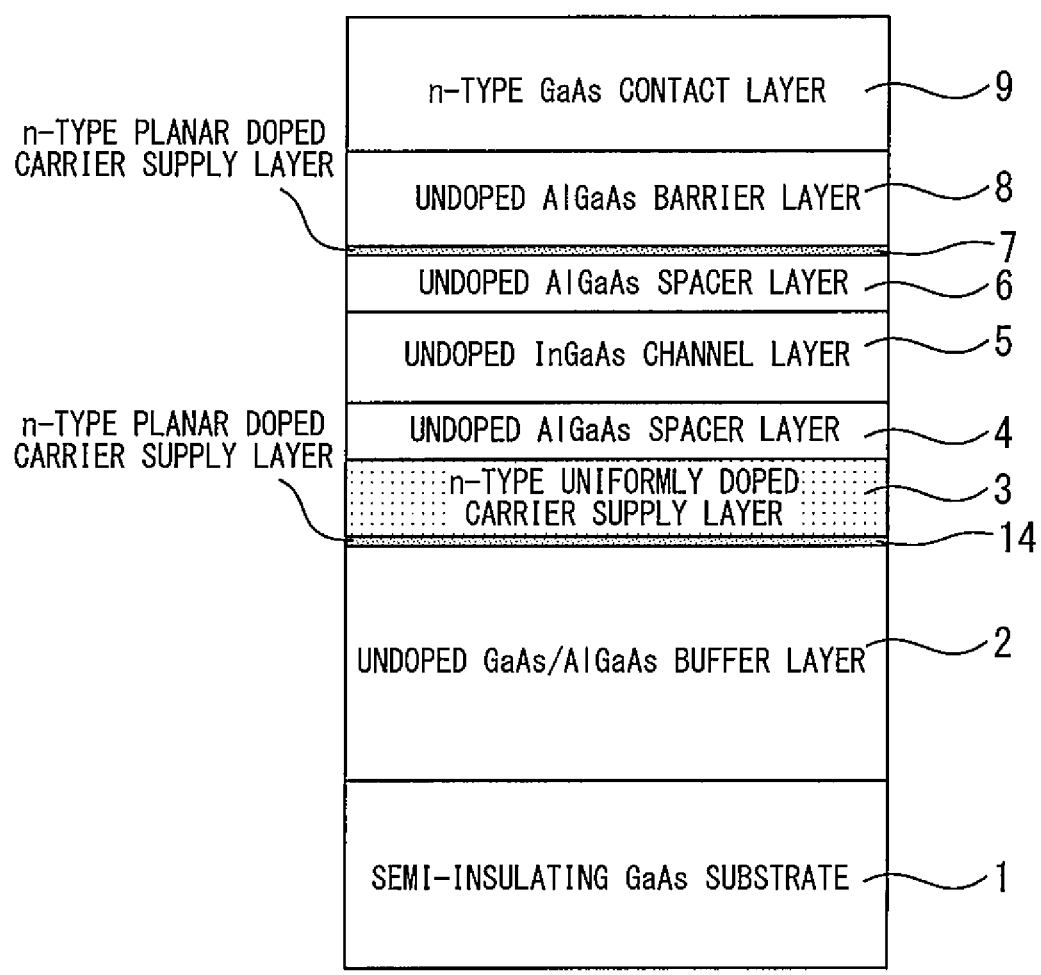
FIG. 5 is a cross-sectional view illustrating a compound semiconductor device according to a second embodiment of the present invention.

FIG. 5 is a cross-sectional view illustrating a compound semiconductor device according to a second embodiment of the present invention. The present embodiment further provides an n-type planar doped carrier supply layer 14 laminated with an n-type AlGaAs uniformly doped carrier supply layer 3 between the buffer layer 2 and the undoped AlGaAs spacer layer 4 in addition to the configuration of the first embodiment. The n-type planar doped carrier supply layer 14 is a planar doped layer in which an impurity is locally doped.

Thus, effects similar to those of the first embodiment can be obtained even when the planar doped layer laminated with the uniformly doped layer is used as the carrier supply layer below the undoped InGaAs channel layer 5. In that case, the thickness of the uniformly doped layer is preferably 10 to 20 nm by taking into account the diffusion from the planar doped layer.

Third Embodiment

Figure 6:
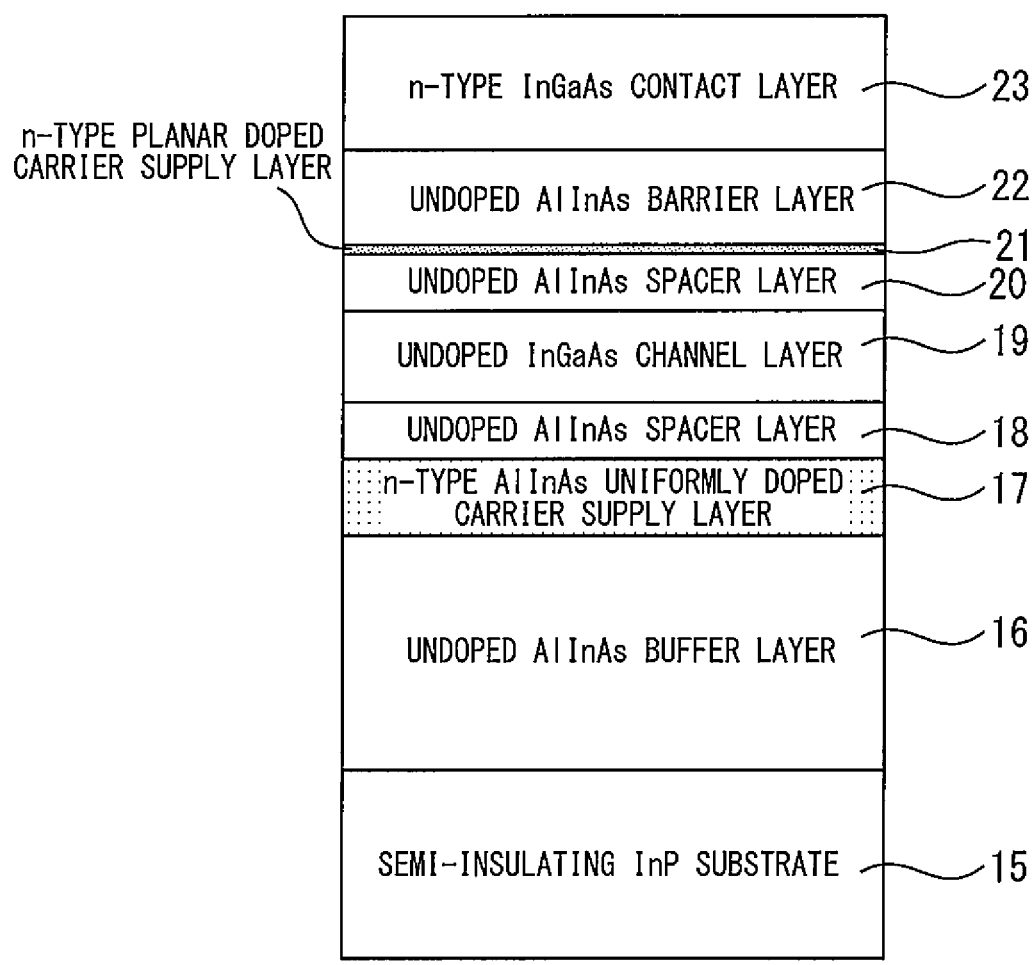
FIG. 6 is a cross-sectional view illustrating a compound semiconductor device according to a third embodiment of the present invention.

FIG. 6 is a cross-sectional view illustrating a compound semiconductor device according to a third embodiment of the present invention. In the present embodiment, an undoped AlInAs buffer layer 16, an n-type AlInAs uniformly doped carrier supply layer 17, an undoped AlInAs spacer layer 18, an undoped InGaAs channel layer 19, an undoped AlInAs spacer layer 20, an n-type planar doped carrier supply layer 21, an undoped AlInAs barrier layer 22, and an n-type InGaAs contact layer 23 are provided in order on a semi-insulating InP substrate 15.

Effects similar to those of the first embodiment can be obtained even when the material of the substrate is changed from GaAs in the first embodiment to InP, from AlGaAs to AlInAs or AlGaInAs, the material of the contact layer is changed from GaAs to InGaAs. However, an In composition (In composition=53%) having lattice matching or pseudo-lattice matching with the semi-insulating InP substrate 15 is used for the undoped InGaAs channel layer 19.

Fourth Embodiment

Figure 7:
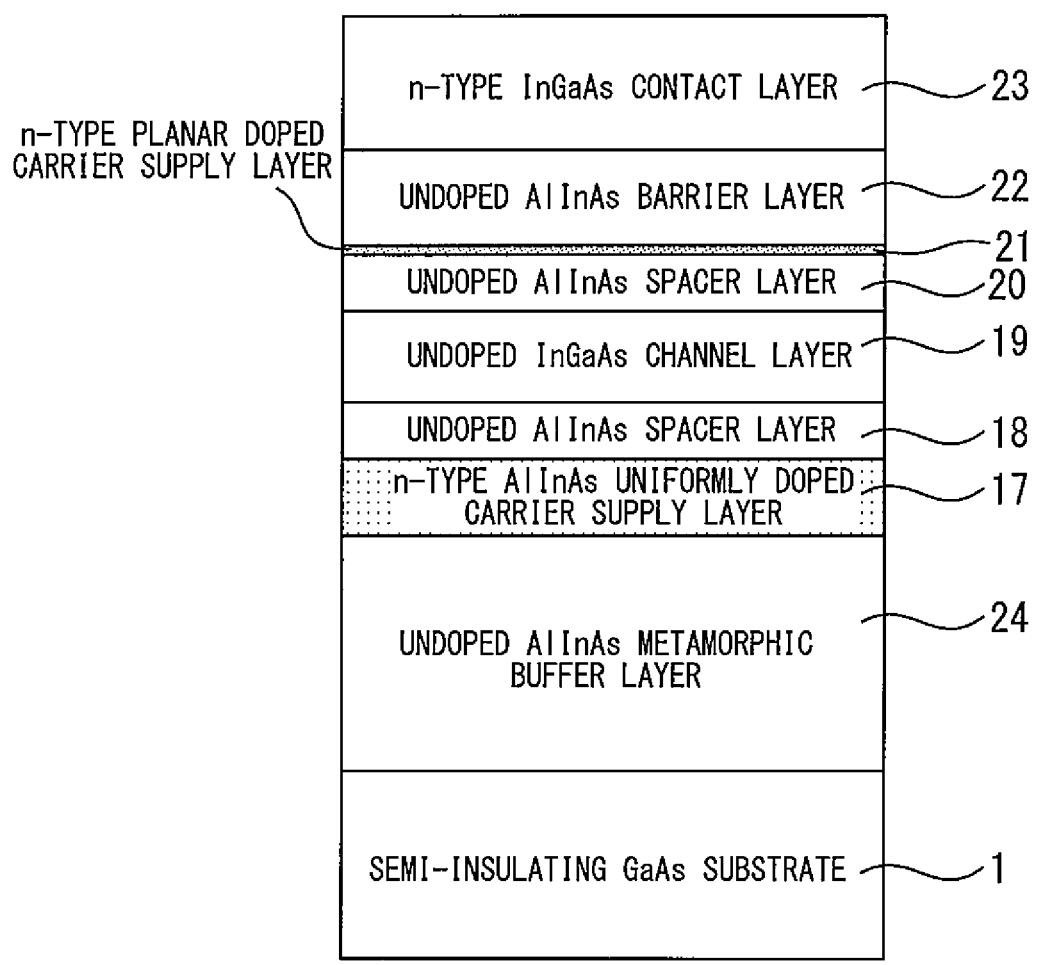
FIG. 7 is a cross-sectional view illustrating a compound semiconductor device according to a fourth embodiment of the present invention.

FIG. 7 is a cross-sectional view illustrating a compound semiconductor device according to a fourth embodiment of the present invention. In the present embodiment, the substrate in the configuration of the third embodiment is changed to a semi-insulating GaAs substrate 1 and the buffer layer is changed to an undoped AlInAs metamorphic buffer layer 24. The undoped AlInAs metamorphic buffer layer 24 has an In composition made to increase in a stepped or graded form from the semi-insulating GaAs substrate 1 side to the n-type AlInAs uniformly doped carrier supply layer 17 side. Note that AlGaInAs may be used as the material of the buffer layer instead of AlInAs and the In composition may be made to increase in a stepped or graded form. It is thereby possible to reduce lattice mismatch between the undoped InGaAs channel layer 19 having an In composition of 40% or more and the semi-insulating GaAs substrate 1 and allow a high-quality InGaAs channel layer to grow.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-099265, filed on May 14, 2015 including specification, claims, drawings and summary, on which the Convention priority of the present application is based, is incorporated herein by reference in its entirety.

What is claimed is:

1. A compound semiconductor device comprising:
a substrate; and
a buffer layer, a first carrier supply layer, a first spacer layer, a channel layer, a second spacer layer, a second carrier supply layer, and a contact layer provided in order on the substrate,
wherein the first carrier supply layer is a uniformly doped layer in which an impurity is uniformly doped,
the second carrier supply layer is a planar doped layer in which an impurity is locally doped, and
no Al mixed crystal layer is provided between the buffer layer and the first spacer layer and between the second spacer layer and the contact layer.

2. The compound semiconductor device of claim 1, further comprising a third carrier supply layer laminated with the first carrier supply layer between the buffer layer and the first spacer layer,
wherein the third carrier supply layer is a planar doped layer in which an impurity is locally doped.

3. The compound semiconductor device of claim 1, wherein
the substrate is a GaAs substrate, and
the first carrier supply layer, the channel layer, and the second carrier supply layer are AlGaAs or InGaAs having lattice matching or pseudo-lattice matching with the GaAs substrate.

4. The compound semiconductor device of claim 1, wherein
the substrate is an InP substrate, and
the first carrier supply layer, the channel layer, and the second carrier supply layer are AlInAs, AlGaInAs or InGaAs having lattice matching or pseudo-lattice matching with the InP substrate.

5. The compound semiconductor device of claim 1, wherein
the substrate is a GaAs substrate,
the first carrier supply layer, the channel layer, and the second carrier supply layer are AlInAs, AlGaInAs or InGaAs, and
the buffer layer is a metamorphic buffer layer which is AlInAs or AlGaInAs having an In composition made to increase in a stepped or graded form from the GaAs substrate side to the first carrier supply layer side.

6. A compound semiconductor device comprising:
a substrate; and
a buffer layer, a first carrier supply layer, a first spacer layer, a channel layer, a second spacer layer, a second carrier supply layer, and a contact layer provided in order on the substrate,
wherein the first carrier supply layer is a uniformly doped layer in which an impurity is uniformly doped,
the second carrier supply layer is a planar doped layer in which an impurity is locally doped, and
Al mixed crystal layers are provided between the buffer layer and the first spacer layer and between the second spacer layer and the contact layer and do not have higher resistance values than the first and second spacer layers.

7. The compound semiconductor device of claim 6, further comprising a third carrier supply layer laminated with the first carrier supply layer between the buffer layer and the first spacer layer,
wherein the third carrier supply layer is a planar doped layer in which an impurity is locally doped.

8. The compound semiconductor device of claim 6, wherein
the substrate is a GaAs substrate, and
the first carrier supply layer, the channel layer, and the second carrier supply layer are AlGaAs or InGaAs having lattice matching or pseudo-lattice matching with the GaAs substrate.

9. The compound semiconductor device of claim 6, wherein
the substrate is an InP substrate, and
the first carrier supply layer, the channel layer, and the second carrier supply layer are AlInAs, AlGaInAs or InGaAs having lattice matching or pseudo-lattice matching with the InP substrate.

10. The compound semiconductor device of claim 6, wherein
the substrate is a GaAs substrate,
the first carrier supply layer, the channel layer, and the second carrier supply layer are AlInAs, AlGaInAs or InGaAs, and
the buffer layer is a metamorphic buffer layer which is AlInAs or AlGaInAs having an In composition made to increase in a stepped or graded form from the GaAs substrate side to the first carrier supply layer side.

* * * * *